United States Patent
Okubo (10) Patent No.: US 9,997,679 B2
(45) Date of Patent: Jun. 12, 2018

(54) LIGHT-EMITTING DEVICE

(71) Applicant: STANLEY ELECTRIC CO., LTD., Meguro-ku, Tokyo (JP)

(72) Inventor: Tsutomu Okubo, Tachikawa (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days. days.

(21) Appl. No.: 15/244,548

(22) Filed: Aug. 23, 2016

(65) Prior Publication Data
US 2017/0062677 A1    Mar. 2, 2017

(30) Foreign Application Priority Data

Aug. 24, 2015 (JP) .................. 2015-165117

(51) Int. Cl.
*H01L 33/56* (2010.01)
*H01L 33/50* (2010.01)

(52) U.S. Cl.
CPC ............ *H01L 33/56* (2013.01); *H01L 33/507* (2013.01); *H01L 2224/14* (2013.01); *H01L 2224/16225* (2013.01); *H01L 2224/48091* (2013.01); *H01L 2224/73265* (2013.01); *H01L 2224/8592* (2013.01); *H01L 2924/181* (2013.01)

(58) Field of Classification Search
CPC ....... H01L 33/58; H01L 33/507; H01L 33/52; H01L 33/44
See application file for complete search history.

(56) References Cited

U.S. PATENT DOCUMENTS

| | | | |
|---|---|---|---|
| 6,744,194 B2 | 6/2004 | Fukasawa et al. | |
| 7,180,240 B2 | 2/2007 | Noguchi et al. | |
| 8,378,366 B2* | 2/2013 | Arndt | H01L 33/56 257/100 |
| 8,476,655 B2* | 7/2013 | Brunner | H01L 33/44 257/98 |
| 2002/0039002 A1* | 4/2002 | Fukasawa | H01L 33/502 313/512 |
| 2009/0261365 A1* | 10/2009 | Brunner | H01L 33/44 257/98 |
| 2010/0230694 A1* | 9/2010 | Arndt | H01L 33/44 257/98 |
| 2011/0012149 A1* | 1/2011 | Basin | H01L 33/60 257/98 |
| 2011/0073889 A1* | 3/2011 | Sugizaki | H01L 25/048 257/98 |
| 2013/0279169 A1* | 10/2013 | Reiherzer | F21V 19/001 362/249.02 |
| 2015/0137165 A1* | 5/2015 | Tagami | H01L 33/507 257/98 |

FOREIGN PATENT DOCUMENTS

JP    2002111073 A    4/2002
JP    2004128424 A    4/2004

* cited by examiner

*Primary Examiner* — Hoang-Quan Ho
(74) *Attorney, Agent, or Firm* — Holtz, Holtz & Volek PC (57) ABSTRACT

A light-emitting device of the invention includes, a first substrate; a light-emitting element mounted on the first substrate and includes a second substrate and a semiconductor structure including a light-emitting layer; and a light-shielding body which is formed only on a surface of the light-emitting element opposite to the first substrate and includes a material including light-shielding particles.

10 Claims, 7 Drawing Sheets

LIGHT-EMITTING DEVICE

BACKGROUND OF THE INVENTION

1. Field of the Invention

The present invention relates to a light-emitting device, in particular to the light-emitting device having a light-emitting diode (LED) or the like.

2. Description of the Related Art

A light-emitting element such as the light-emitting diode or the like is manufactured normally as follows: an n-type semiconductor layer, a light-emitting layer, and a p-type semiconductor layer are grown on a growth substrate, and then an n-electrode and a p-electrode are formed on the n-type semiconductor layer and the p-type semiconductor layer respectively for applying a voltage thereto. Further, the light-emitting element is fixed on a first substrate on which wirings or the like are formed, and then is sealed on the light extraction surface with resin or the like to form the light-emitting device.

In recent years, there is achieving high luminance of the light-emitting element, high luminance elements are marketed and readily available. In addition to achieving high luminance of the light-emitting element, there are demands for the use of indicators or the like or low luminous intensity products.

Japanese Patent Application Laid-Open No. 2002-111073 discloses a light-emitting diode in which the adjusting of color tone is achieved by adding phosphor particles and pigment particles to a resin material for sealing and protecting the light-emitting element chip. Japanese Patent Application Laid-Open No. 2004-128424 discloses a white light-emitting device in which the adjusting of luminance variance is achieved by adding a black-based pigment as a light-extinction material mixed with phosphor particles to a covering member.

According to the light-emitting device disclosed in Japanese Patent Application Laid-Open No. 2004-128424, it has been difficult to control the luminous intensity of device by adjusting the amount of black-based pigments to be mixed to the covering member with phosphor particles, because change in the luminous intensity with respect to the change of the mixture ratio of pigments is so large. Further, there are difficulties to obtain a light emission surface for uniformed luminance and chromaticity. Further, since the covering member becomes black as a whole, design characteristic (light emission surface color) becomes differed in comparison with the light-emitting device without the black pigment.

SUMMARY OF THE INVENTION

The present invention has been made in view of the aforementioned respects. It is an object of the present invention to provide a light-emitting device capable of readily adjusting the luminous intensity.

To achieve the above mentioned object, there is provided a light-emitting device of the present invention comprises:
 a first substrate;
 a light-emitting element which is mounted on said first substrate and includes
  a second substrate and
  a semiconductor structure layer which is formed on said second substrate and includes a light-emitting layer; and
 a light-shielding body which is formed only on a surface of the light-emitting element opposite to said first substrate and includes a material including light-shielding particles.

DETAILED DESCRIPTION OF THE INVENTION

Preferred embodiments of the present invention will be described in detail below. In addition, substantially the same or equivalent parts will be denoted by the same reference numerals in the following description and accompanying drawings.

[Embodiment 1]

Figure 1A:
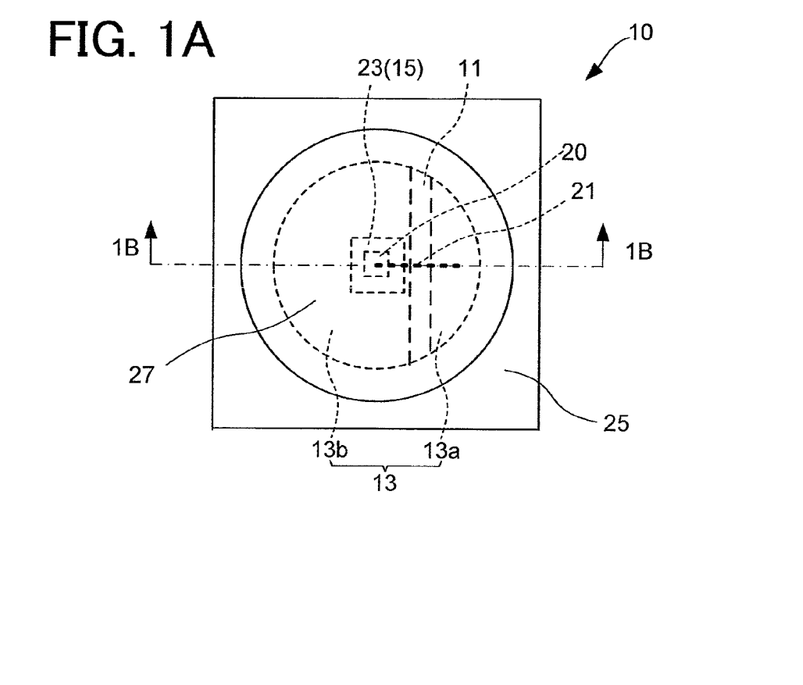
FIG. 1A is a plan view showing an upper surface of a light-emitting device of Embodiment 1.
Figure 1B:
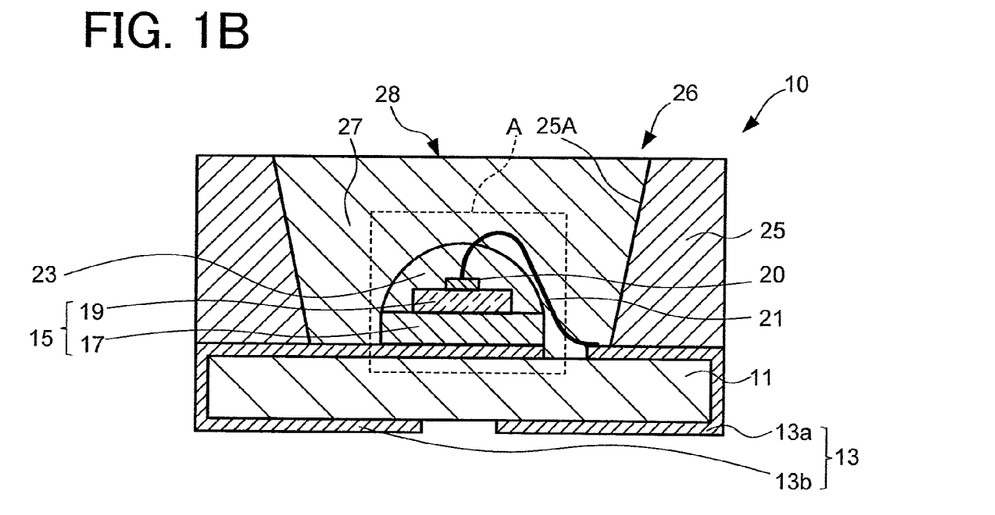
FIG. 1B is a cross-sectional view of the light-emitting device of Embodiment 1.

FIG. 1A is a plan view showing an upper or a top surface of a light-emitting device 10 illustrating its configuration. FIG. 1B is a cross-sectional view cut out along with a line 1B-1B of FIG. 1A.

A package substrate 11 (or mounting substrate), i.e. a first substrate is a glass epoxy substrate, for example. Alternatively, a glass silicone substrate, or a substrate made of ceramic material such as alumina, AlN or the like can be used for the package substrate 11. A connection electrode 13 is provided on a surface of the package substrate 11, and formed by plating or the like of a conductor such as Cu or the like on the surface.

The connection electrode 13 includes a p-connection electrode layer 13a and an n-connection electrode layer 13b. Each of the connection electrode layers 13a and 13b is formed so as to extend from one major surface of the package substrate 11 (the upper or top surface) to the other major surface (a lower or bottom surface) thereof over a side surface of the package substrate 11. The p-connection electrode layer 13a and the n-connection electrode layer 13b are insulated from each other because they are formed to be separated from each other on the surface of the package substrate 11.

A light-emitting element 15 is mounted on the n-connection electrode 13b formed on the one major surface of the package substrate 11 (i.e., on the upper or top surface). The light-emitting element 15 has an area of shape in a plan view smaller than that of the package substrate 11. Therefore, the upper surfaces of a portion of the package substrate 11, the p-connection electrode 13*a* and the n-connection electrode 13*b* are exposed from the light-emitting element 15 around the light-emitting element 15 on the upper surface side of the package substrate 11. Specifically, surfaces facing or directed to the same direction of the upper or top surface of the package substrate 11 may be called as upper surfaces respectively in the description below. Further, surfaces facing the opposite direction to the top surface of the package substrate 11 may be called as lower surfaces respectively in the description below. Still further, the direction in which the upper or top surface of the package substrate 11 is facing may be explained as an upward direction. Its opposite direction may be explained as a downward direction.

Figure 2:
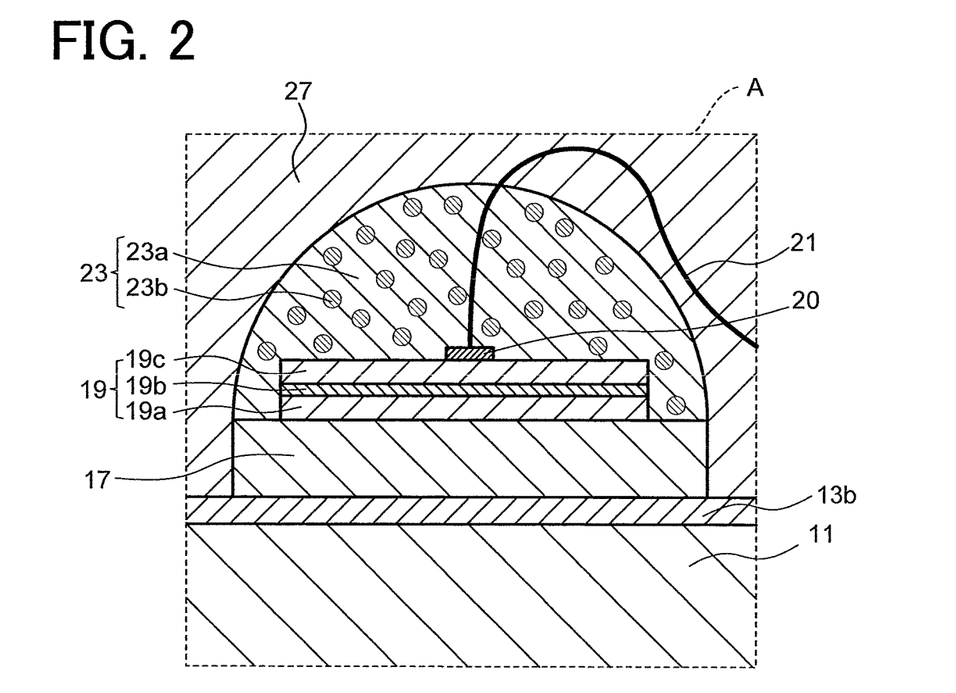
FIG. 2 is a partially enlarged cross-sectional view of the light-emitting device of Embodiment 1.

The light-emitting element 15 includes an element substrate 17 as a second substrate and a semiconductor structure layer 19 including a light-emitting layer 19*b* mounted on the upper surface of the element substrate 17 (see FIG. 2). The element substrate 17 is made from a light-transmissive substrate having electrical conductivity and light transmissivity to emission light from the light-emitting layer 19*b* such as SiC or the like. The element substrate 17 is fixed on the n-connection electrode 13*b* by, for example, an electrically conductive die-attach adhesive (not shown) such as an Ag paste or the like. That is to say, the element substrate 17 is electrically connected to the n-connection electrode 13*b*.

The semiconductor structure layer 19 is formed in such a manner that, for example, InGaN-based semiconductor layers including the light-emitting layer are layered or bonded on the element substrate 17. Each of the semiconductor layers of the semiconductor structure layer 19 are layered using a crystal growth such an epitaxial growth of semiconductor materials. The light-emitting layer of the semiconductor structure layer 19 may emit blue light of wavelength about 450 nm, for example.

An upper surface electrode 20 is provided on the upper surface of the semiconductor structure layer 19. The upper surface electrode 20 is made of at least one of conductive materials of Au or the like. The upper surface electrode 20 is connected to the p-connection electrode 13*a* by wire-bonding using a conductive wire 21 such as Au or the like.

Alight-shielding body 23 is formed to bury the semiconductor structure layer 19 on the upper surface of the light-emitting element 15. The light-shielding body 23 is a resin body or glass body containing light-shielding particles. In other words, the light-shielding body 23 is formed to cover the upper (or top) surface and the side surface of the semiconductor structure layer 19 as well as the upper surface of the element substrate 17. In other words, the light-shielding body 23 is formed only on the surface side opposite to the package substrate 11 of the light-emitting element 15.

A reflector 25 is a columnar frame fixed onto the upper surface of the package substrate 11 by an adhesive material such as an epoxy resin or the like. The reflector 25 is made of a so-called white resin comprising a silicone resin or the like and light-scattering materials dispersed therein. The reflector 25 has a through hole 25A. The through hole 25A has an inverted truncated conical shape expanding and elevating from the upper surface of the package substrate 11.

As mentioned above, the upper surface of a portion of the package substrate 11 (on which the light-emitting element 15 is mounted) and the upper surfaces of the connection electrode 13 are exposed from the light-emitting element 15 at the periphery of the light-emitting element 15. The reflector 25 is provided on the concerned exposed surfaces, i.e. the upper surfaces of the package substrate 11 and the connection electrode 13. That is to say, the light-emitting element 15 is enclosed by the inner wall surface (internal side surface) of the through hole 25A on the package substrate 11. In other words, the reflector 25 is the frame surrounding the light-emitting element 15.

A cavity 26 is formed to have an inverted truncated conical shape (e.g. mortar shape) with the upper surface of the package substrate 11 and the inner wall surface of the through hole 25A in the reflector 25. That is to say, the reflector 25 and the package substrate 11 compose the cavity 26. The light-emitting element 15 is disposed on the bottom of the mortar shaped cavity 26. By such configuration, emission light from the light-emitting layer 19*b* of the light-emitting element 15 is reflected at the inner wall surface of the reflector 25 to advance upward.

That is to say, the inner wall surface of the reflector 25 plays the role of the reflective surface reflecting the emission light from the light-emitting layer 19*b* or from the element 15.

In order to form the reflector 25 with resins, for example, an epoxy resin, or polyamide-based resin or the like may be used. Further, for the light-scattering material, $TiO_2$, BN, $Al_2O_3$, ZnO, $BaSO_4$, $SiO_2$ or the like may be used as white pigment particles.

An example that the reflector 25, the connection electrode 13, and the package substrate 11 are formed separately is described in the present Embodiment. In addition to this example, there may be used a PLCC (Plastic leaded chip carrier) type package in which is a reflector 25 made of resin and a package substrate 11 made of resin and the connection electrode 13 made of metal are integrally formed (into an integrated one piece) by an insert molding method. In case that PLCC type package is used, polyamide-based resins may be used for materials of the package substrate 11 and the reflector 25, for example.

A sealing body 27 is a light-transmissive resin made of silicone-based resin or the like and filled within the cavity 26 of the reflector 25. That is to say, the light-emitting element 15, the bonding wire 21, and the light-shielding body 23 are buried in the cavity 26 with the sealing body 27. In other words, the sealing body 27 is formed to bury the light-emitting element 15, the bonding wire 21, and the light-shielding body 23 on the package substrate 11. The upper (or top) surface of the sealing body 27 is a light emission surface 28 of the light-emitting device 10.

The sealing body 27 includes phosphor particles and the light-scattering material. There may be used as the phosphor particles, for example, phosphor particles which produce yellow fluorescence exited by blue light such as Ce-activated yttrium-aluminum-garnet phosphor (YAG:Ce), Ce-activated terbium-aluminum-garnet phosphor (TAG:Ce), orthosilicate phosphor (($BaSrCa)SiO_4$, etc.), α-Sialon phosphor (Ca-α-SiAlON:Eu or the like) or the like. The light-scattering material is particles capable of light scattering such as $TiO_2$, $SiO_2$, ZnO, $Al_2O_3$ particles or the like.

FIG. 2 is an enlarged partially cross-sectional view of a portion A encircled with a broken line in FIG. 1B. The semiconductor structure layer 19 is formed as InGaN-based semiconductor layers on the element substrate 17 such that an n-type semiconductor layer 19*a*, the light-emitting layer 19*b* and a p-type semiconductor layer 19*c* are layered in this order.

As mentioned above, the light-shielding body 23 is a resin body or glass body on the upper surface of the element substrate 17 and covers the upper surface of the element substrate 17 and the surface of the semiconductor structure layer 19. The light-shielding body 23 comprises a base material 23a and light-shielding particles 23b contained and supported in the base material 23a.

The base material 23a is a resin material or glass material such as silicone-based resin, epoxy-based resin, acrylic-based resin or the like. The light-shielding particles 23b are black pigment particles having insulation quality and absorbing outgoing light from the light-emitting layer 19b such as TiN or the like. For the light-shielding particles 23b, titanium-based black pigment particles can be used, for example.

The titanium-based black particles in the present Embodiment is a titanium black available from Mitsubishi Materials Electronic Chemicals Co., Ltd., which is titanium-based black particles of mixture of TiO and TiN having a color lightness $L^*=0$(black)–$L^*=100$(white)) of less than or equal to 16 in a L value (($L^*$, $a^*$, $b^*$) color space, and having the diameters of primary particles of 80-100 nm. It is preferable that the light-shielding particles 23b are inorganic-based particles which are highly resistant to light and heat.

In case that the light-shielding body 23 is configured as a resin body, such a resin body can be formed by mixing the base material 23a, e.g. a liquid resin containing any solvent and the light-shielding particles 23b as a precursor of a liquid mixture and then dropping and coating the liquid mixture on the upper surface of the light-emitting element 15 and then curing and drying it, for example.

In case that the light-shielding body 23 is configured as a glass body, such a glass body can be formed by a sol-gel process (repetition of hydrolyzing and polymerization) for example. Specifically, the light-shielding body 23 can be formed by dispersing the light-shielding particles 23 in an alkoxide of precursor as the base material 23a to prepare a light-shielding particle dispersion sol and then gelling it as a gel state and then applying the gel state on the upper surface of the light-emitting element 15 and then heating it, for example.

In addition, the light-shielding body 23 can be formed in a dome shape on the upper surface of the light-emitting element 15. The light-shielding body 23 is composed such that the thickness of the central portion is thicker in comparison with the peripheral portion. Further, the light-shielding body 23 is formed only on the upper surface of the light-emitting element 15 without covering the side surface of the element substrate 17. Namely, it is preferable that the light-shielding body 23 is formed to cover only a surface of the light-emitting element 15 opposite to the package substrate 11. In other words, it is preferable that the light-shielding body 23 is formed to cover only the upper (or top) surface and the side surface of the semiconductor structure layer 19 and the upper (or top) surface of the element substrate 17.

For example, in order that the liquid mixture of the precursor of resin and the light-shielding particles 23b has a suitable surface tension to the upper surface of the light-emitting element 15 when the liquid mixture is supplied thereto, the liquid mixture materials are selected and the liquid mixture blending ratio is adjusted, thereby the light-shielding body 23 is formed only on the upper surface of the light-emitting element 15 without wettedly spreading of the liquid mixture on the side surface of the element substrate 17.

Further, an outer edge of the upper surface of the light-emitting element 15 defines a formation range of the light-shielding body 23 on the upper surface of the light-emitting element 15. That is to say, it is capable of making an outer edge of the lower surface of the light-shielding body 23 coincide with the outer edge of the upper surface of the light-emitting element 15. As a result, it achieves to improve the reproducibility of the shape of the light-shielding body 23, thereby to lead to good production yield of the light-emitting devices.

As mentioned above, in the light-emitting device 10, the light-shielding body 23 covers the upper surface and the side surface of the semiconductor structure layer 19 and the upper surface of the element substrate 17. Therefore, light emitted from the semiconductor structure layer 19 is transmitted through the light-shielding body 23 and then is transmitted into the sealing body 27 or passes through the transparent element substrate 17 and then is transmitted into the sealing body 27.

Light emitted from the top surface and the side surface of the semiconductor structure layer 19 is transmitted into the light-shielding body 23. A certain portion of the entered light into the light-shielding body 23 is absorbed by the light-shielding particles 23b, remaining light not absorbed is transmitted through the light-shielding body 23 to the sealing body 27. Namely, the emission light from the top surface and the side surface of the semiconductor structure layer 19 is absorbed by the light-shielding body 23 to be attenuated, resulting in adjustment of the luminous intensity, prior to entering the sealing body 27.

Further, the emission light from the bottom surface of the semiconductor structure layer 19 is transmitted through the transparent element substrate 17 in multiple reflection or the like to the periphery of the element substrate 17 and then is radiated from the side surface of the element substrate 17. That is to say, the emission light from the side surface of the element substrate 17 is transmitted with little attenuation to the sealing body 27 without entering the light-shielding body 23.

As mentioned above, the emission light from the light emission surface 28 of the light-emitting device 10 comprises the attenuated light passing through the light-shielding body 23 and the radiated light from the side surface of the element substrate 17 without entering the light-shielding body 23. The luminous intensity of the emitted light from the light emission surface 28 can be adjusted by changing an attenuation factor of light transmitted through the light-shielding body by controlling the concentration of the light-shielding particles 23b in the light-shielding body 23.

As mentioned above, the emission light from the light-emitting layer 19b in the present Embodiment is blue light. Further, the sealing body 27 includes silicate phosphor particles of yellow luminescence. The silicate phosphor is excited by the blue light to emit yellow luminescence i.e., complementary color of blue. Therefore, by the additive color mixture of the blue light and the yellow light, the emission light from the light emission surface 28 becomes white light.

Further, the emission light from the light-emitting layer 19b is radiated from the light emission surface 28 after scattered by the light-scattering material or phosphor particles in the sealing body 27. By this, emission light with homogenized luminance can be obtained at the light emission surface 28.

Therefore, the light emission surface 28 radiates white light which is adjusted in the chromaticity by the phosphor particles and is homogenized in the luminance by the light-scattering material.

[Comparative Evaluation]

Figure 3:
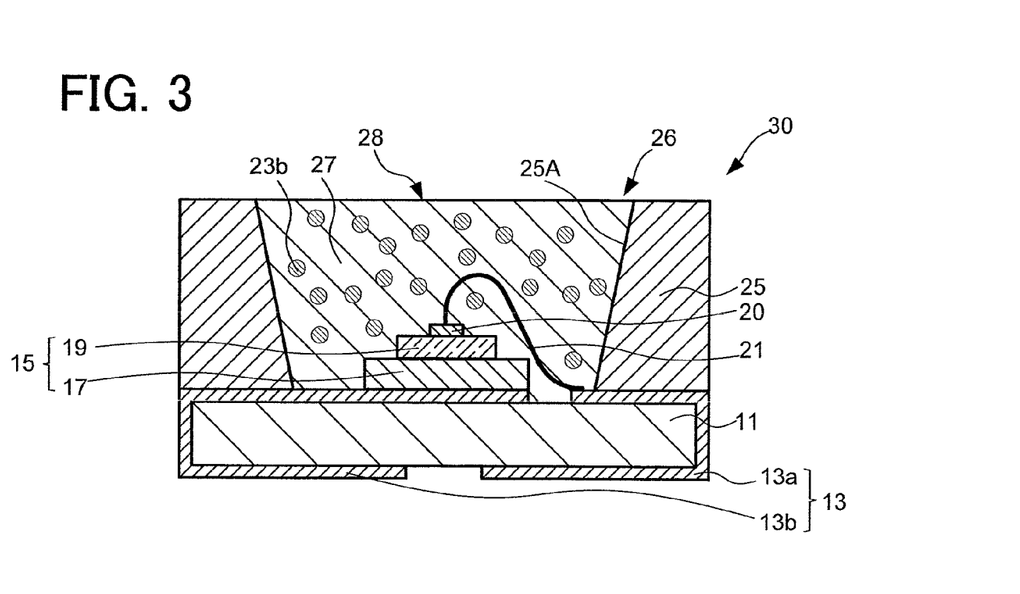
FIG. 3 is a cross-sectional view of a light-emitting device of comparative example.

There were conducted comparative evaluations on feasibility of the luminous intensity adjusting for the light-emitting device 10 of Embodiment 1 while using a comparative example of a light-emitting device. FIG. 3 is a cross-sectional view of a light-emitting device 30 of the comparative example. The comparative example of the light-emitting device 30 has substantially the same configuration of the Embodiment 1 of the light-emitting device 10 except that the light-shielding body is missing, and the light-shielding particles are contained in the sealing body.

In this comparative evaluation, PLCC type packages were used for the light-emitting devices 10 and 30 respectively in which the package substrates 11 and the reflectors 25 made of polyamide-based resin are integrally formed with the connection electrodes 13. Further, the base material 23a of silicone resin and the light-shielding particles 23b of titanium-based black particles, i.e. titanium black mentioned above were used for the light-shielding body 23.

Further, silicone resin was used for the sealing bodies 27, and phosphor particles to be contained therein were silicate phosphor. In addition, the sealing body 27 had not any light-scattering material, unlike the foregoing Embodiment. Further, the light-emitting device 30 of the comparative example had the light-shielding particles 23b in the sealing body 27.

The light-emitting devices of Embodiment 1 and the comparative example were allowed to flow forward electric currents of the same amount and then the luminous intensities of emission light emitted from the light emission surface 28 were evaluated in the comparative evaluations. Specifically, there were evaluated on correlations between the luminous intensities and the concentrations of the light-shielding particles 23b in the light-shielding body 23 of Embodiment 1 and the sealing body 27 of comparative example respectively. In addition, the concentrations of the light-shielding particles 23b were measured with the percent concentration of mass [mass %] in the resin precursor solution of the base material 23a during the present experiment. Further, the luminous intensity was measured with the relative luminous intensity to 100% of no light-shielding particle.

Figure 4:
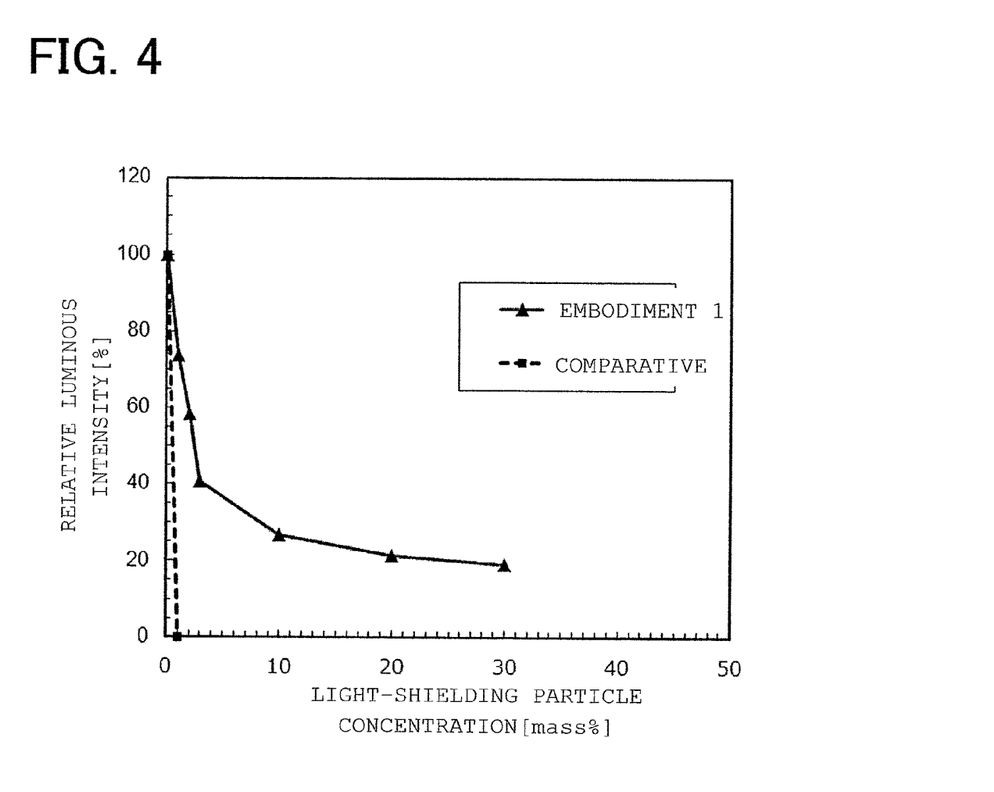
FIG. 4 is a graph showing relationships between concentrations of light-shielding particles and relative luminous intensities in a light-shielding body of the light-emitting device of Embodiment 1.

FIG. 4 is a graph showing relationships resulted from the comparative evaluations on the light-emitting devices of Embodiment 1 and the comparative examples. In the graph of FIG. 4, the horizontal axis represents concentrations of the light-shielding particles and the vertical axis represents the relative luminous intensities.

As shown in FIG. 4, in the characteristics of the light-emitting device 30 of comparative example, when the light-shielding particles concentration rises from 0% to 1%, the relative luminous intensity falls from 100% to 0%. In contrast, for the light-emitting device 10 of Embodiment 1, while the concentrations of the light-shielding particles 23b rises from 0% to 30%, the relative luminous intensity is lowered slowly. Therefore, it is found that controllability to the luminous intensity with the concentration of the light-shielding particles 23b in the light-emitting device 10 of Embodiment 1 is higher than that in the light-emitting device 30 of comparative example.

Further, in the light-emitting device of Embodiment 1, when the concentration of the light-shielding particles 23b becomes 20%, the decrement of the luminous intensity becomes saturated, after that, the luminous intensity is not substantially changed. It is expected that, when the concentrations of the light-shielding particles 23b exceeds 20%, the shading capability of the light-shielding body 23 become sufficient to shield the emission light from the upper surface and the side surface of the semiconductor structure layer 19, for no change of luminous intensity occurs. That is to say, it is expected that, when the concentration of the light-shielding particles 23b rises more than a constant value, the emission light from the light-emitting element 15 may go out only from the side surface of the element substrate 17, there is no change of the luminous intensity.

In case that the element substrate 17 has light-transmissivity in the Embodiment 1, the concentration of the light-shielding particles 23b in the light-shielding body 23 is set a high value, so that no emission of light occurs from the upper or top surface of the light-emitting element 15. Namely, a perfect light-shielding of the upper surface of the light-emitting element 15 allows light to emit only from the side surface of the element substrate 17. The perfect light-shielding is achieved by setting the concentration of the light-shielding particles 23b in the light-shielding body 23 to a concentration value higher than a certain constant value. Therefore, the embodiment provides easier management for the concentration of the light-shielding particles 23b in comparison with a case in which non-perfect or non-complete light-shielding is required. Thus, as to the luminous intensity of emission light from the light emission surface 28, there is obtained stabilization in luminous intensity among individuals of the light-emitting device 10. That is to say, the Embodiment readily provides manufacturing of the light-emitting devices having the same luminous intensity with high productivity and yield.

In the light-emitting device 10 of the present Embodiment, the upward outgoing light from the semiconductor structure layer 19 to the light emission surface 28 has a shorter optical path length in comparison with light transmitted toward the horizontal direction within the semiconductor structure layer 19.

Such light with the short optical path length is subjected insufficiently to mixed color adjusting which is caused both by light scattering by the light-scattering material and wavelength conversion occurred by phosphor particles. Then the light with the short optical path length is radiated from the light emission surface 28 with inadequate mixed color adjusting. Therefore, there is apt to exhibit an uneven chromaticity region on the light emission surface 28, for example, the white emission light is partially bluish or the like.

In the light-emitting device 10, at least a portion of light with the short optical path length is absorbed by the light-shielding body 23. As a result, the occurrence phenomenon of the insufficient region of mixed color adjusting is suppressed in the emission light from the light emission surface 28. Therefore, the mixed color adjusting caused by the light-scattering material and phosphor is sufficiently exhibited on the light emission surface 28, so that more uniformized light in the chromaticity is obtained from the light emission surface 28.

Further, the light-emitting device 10 has a propensity that the upward outgoing light from the semiconductor structure layer 19 to the light emission surface 28 is not sufficiently scattered because the optical path length of the outgoing light therebetween is short. As a result, the light emission surface 28 is apt to have a central portion having a high luminance region, for example, so that it may cause non-uniform of luminance of the emission light from the light emission surface 28.

In the light-emitting device 10, at least a portion of light with the short optical path length is absorbed by the light-shielding body 23, thereby the occurrence phenomenon of the foregoing high luminance region is suppressed. Therefore, according to the light-emitting device 10 of Embodiment 1, the light-scattering caused by the light-scattering material is sufficiently exhibited, so that more uniformized light with luminance is obtained from the light emission surface 28.

The dependence of the visibility on angles in the chromaticity of the emission light from the light-emitting device 10 of the present Embodiment was compared to that of the light-emitting device of comparative example having the similar configuration which is estimated as a conventional product no having the light-shielding particles 23b in the sealing body 27. The evaluation was conducted that, on the basis of the CIE chromaticity coordinate, the optical axis of the light-emitting element was set to angle 0°, after that, the degree of color separation was measured for angles −60°-+60° with $\Delta C_x \Delta C_y$. The light-emitting device 10 of the present Embodiment provides the degree of color separation alleviated more than that of the conventional product. That is to say, the light-emitting device 10 of the present Embodiment enables to lower the dependence of the visibility on angles in the chromaticity of the emission light.

Further, the light-emitting device 10 of Embodiment 1 has the light-shielding body 23 including the light-shielding particles 23b for adjusting the luminous intensity such that the light-shielding body 23 is formed only on the upper surface of the light-emitting element 15 and, the light-shielding body 23 and the light-emitting element 15 are buried in the sealing body 27. Thus, little difference in device appearance occurs on the light emission surface side caused by presence/absence of addition of the light-shielding particles 23b into the light-shielding body 23. Therefore, according to the light-emitting device of the foregoing Embodiment, it is possible to adjust the luminous intensity without changing the design characteristic of the light-emitting device.

[Embodiment 2]

Figure 5A:
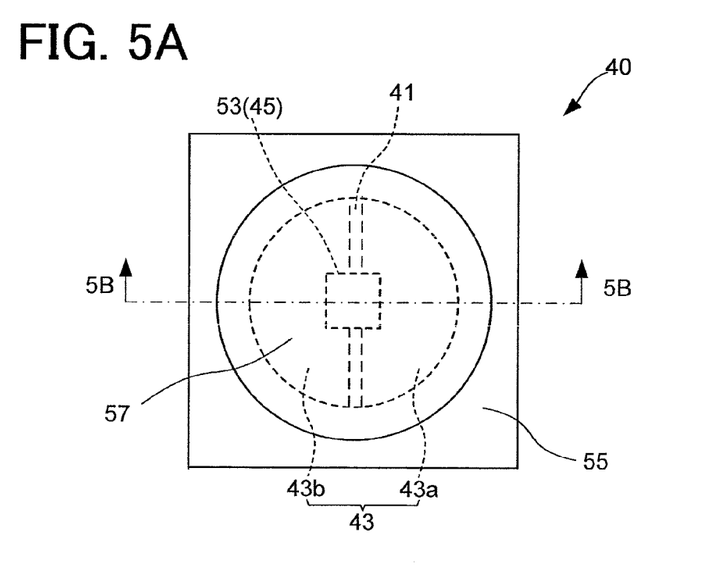
FIG. 5A is a plan view showing an upper surface of a light-emitting device of Embodiment 2.
Figure 5B:
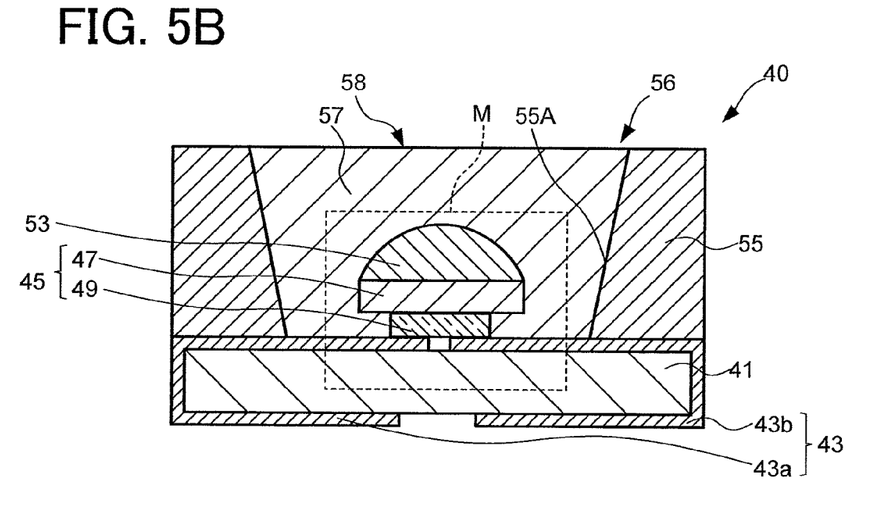
FIG. 5B is a cross-sectional view of the light-emitting device of Embodiment 2.

FIG. 5A is a plan view showing an upper surface of a light-emitting device 40. FIG. 5B is a cross-sectional view cut out along with a line 5B-5B of FIG. 5A.

A package substrate 41 of the first substrate is a glass epoxy substrate, for example. In addition, a glass silicone substrate, or a substrate made of ceramic material such as alumina, AlN or the like can be used for the package substrate 41. A connection electrode 43 is provided on a surface of the package substrate 41, and formed by plating or the like of a conductor such as Cu or the like on the surface. The connection electrode 43 includes a p-connection electrode layer 43a and an n-connection electrode layer 43b.

Each of the connection electrode layers 43a and 43b is formed so as to extend from one major surface of the package substrate 41 (i.e., the upper or top surface) to the other major surface (i.e., the lower or bottom surface) over a side surface thereof. The p-connection electrode layer 43a and the n-connection electrode layer 43b are insulated from each other because they are formed to be separated from each other on the surface of the package substrate 41.

A light-emitting element 45 is mounted on the n-connection electrode 43b formed on the one major surface of the package substrate 41 (i.e., on the upper or top surface). The light-emitting element 45 has an area of shape in a plan view smaller than that of the package substrate 41. Therefore, the upper surfaces of a portion of the package substrate, the p-connection electrode 43a and the n-connection electrode 43b are exposed from the light-emitting element 45 around the light-emitting element 45 on the upper surface side of the package substrate 41. In addition, surfaces facing the same direction of the upper surface of the package substrate 41 may be called upper surfaces respectively in the description below. Further, surfaces facing the opposite direction to the upper surface may be called as lower surfaces respectively. Still further, the direction in which the upper surface of the package substrate 41 is facing may be explained as the upward direction. Its opposite direction may be explained as the downward direction.

Figure 6:
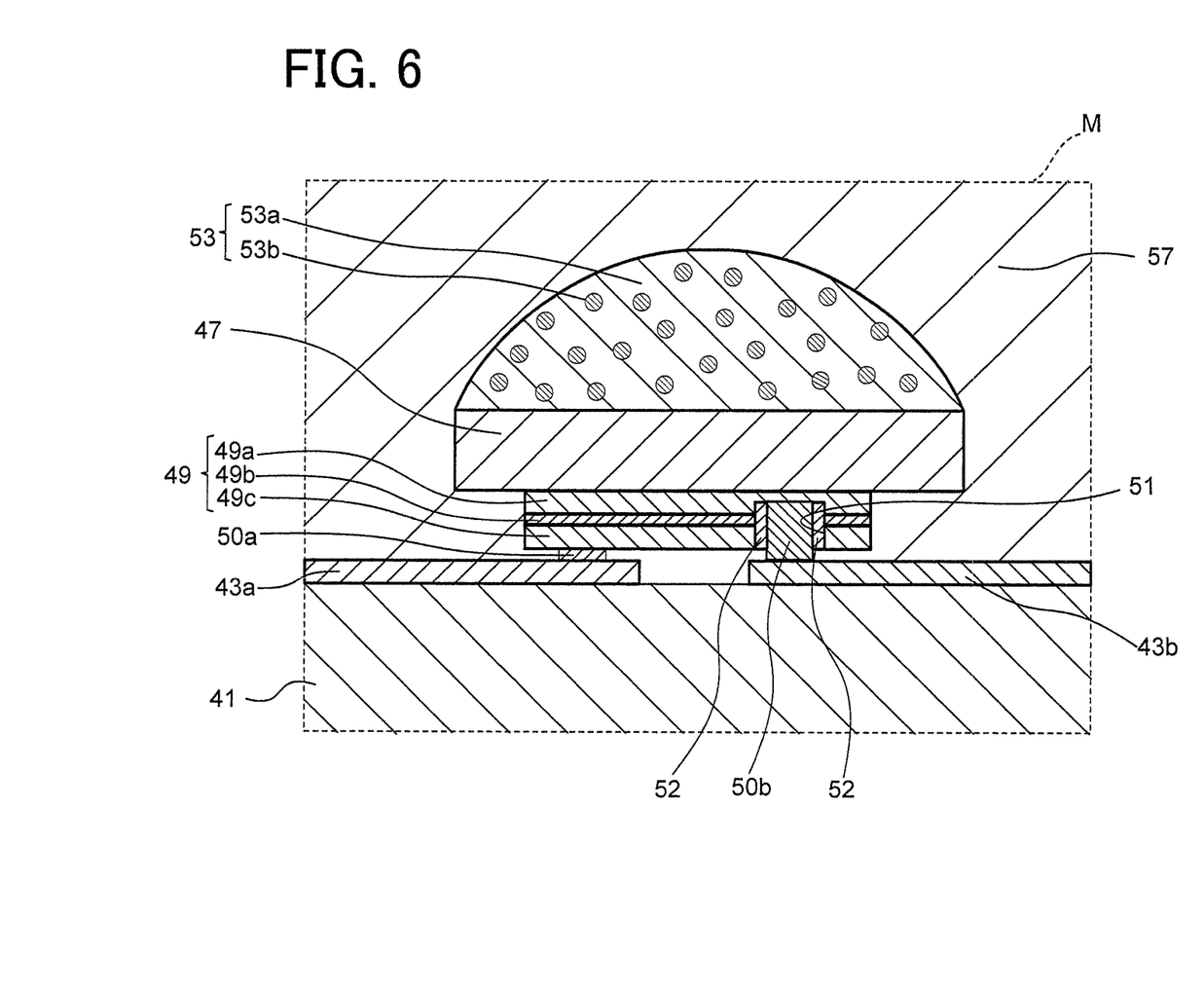
FIG. 6 is an enlarged partially cross-sectional view of the light-emitting device of Embodiment 2.

The light-emitting element 45 includes an element substrate 47 as a second substrate and a semiconductor structure layer 49 including a light-emitting layer 49b mounted on the lower surface of the element substrate 47 (see FIG. 6). The element substrate 47 is made from a light-transmissive substrate having light transmissivity to emission light from the light-emitting layer 49b, such as SiC, sapphire ($Al_2O_3$) or the like. As far having the light transmissivity, the element substrate 47 may have electrical conductivity as SiC or may not have electrical conductivity as sapphire.

The semiconductor structure layer 49 is formed in such a manner that, for example, InGaN-based semiconductor layers including the light-emitting layer are layered or bonded on the element substrate 47. Each of the semiconductor layers of the semiconductor structure layer 19 is layered using a crystal growth such an epitaxial growth of semiconductor materials. The light-emitting layer of the semiconductor structure layer 49 may emit blue light of wavelength about 450 nm, for example. That is to say, the light-emitting element 45 is formed such that the semiconductor structure layer 49 and the element substrate 47 are layered on the package substrate 41 in this order.

A light-shielding body 53 is a resin body or glass body including light-shielding particles and is formed so as to cover the upper surface of the light-emitting element 45. In other words, the light-shielding body 53 is formed on a surface of the light-emitting element 45 opposite to the package substrate 41.

A reflector 55 is a columnar frame fixed onto the upper surface of the package substrate 41 by an adhesive material such as an epoxy resin or the like. The reflector 55 is made of a so-called white resin comprising a silicone resin or the like and light-scattering materials dispersed therein. The reflector 55 has a through hole 55A. The through hole 55A has an inverted truncated conical shape expanding and elevating from the upper surface of the package substrate 41. As mentioned above, the upper surface of a portion of the package substrate 41 (on which the light-emitting element 45 is mounted) and the upper surfaces of the connection electrode 43 are exposed from the light-emitting element 45 at the periphery of the light-emitting element 45. The reflector 55 is provided on the concerned exposed surfaces, i.e. the upper surfaces of the package substrate 41 and the connection electrode 43. That is to say, the light-emitting element 45 is enclosed by the inner wall surface (internal side surface) of the through hole 55A on the package substrate 41. In other words, the reflector 55 is the frame surrounding the light-emitting element 45.

A cavity 56 is formed to have an inverted truncated conical shape (e.g. mortar shape) with the upper surface of the package substrate 41 and the inner wall surface of the through hole 55A in the reflector 55. That is to say, the reflector 55 and the package substrate 41 compose the cavity 56. The light-emitting element 45 is disposed on the bottom of the mortar shaped cavity 56. By such configuration, emission light from the light-emitting layer 49b of the light-emitting element 45 is reflected at the inner wall surface of the reflector 55 to advance upward. That is to say, the inner wall surface of the reflector 55 plays the role of the reflective surface reflecting the emission light from the light-emitting layer 49b.

In order to form the reflector 55 with resins, for example, an epoxy resin, or polyamide-based resin or the like may be used. Further, for the light-scattering material, TiO$_2$, BN, Al$_2$O$_3$, ZnO, BaSO$_4$, SiO$_2$ or the like may be used as white pigment particles.

An example that the reflector 55, the connection electrode 43, and the package substrate 41 are formed separately is described in the present Embodiment. In addition to this example, there may be used a PLCC (Plastic leaded chip carrier) type package in which is a reflector 55 made of resin and a package substrate 41 made of resin and the connection electrode 43 made of metal are integrally formed (into an integrated one piece) by an insert molding method. In case that PLCC type package is used, polyamide-based resins may be used for materials of the package substrate 41 and the reflector 55, for example.

A sealing body 57 is a light-transmissive resin made of silicone-based resin or the like and filled within the cavity 56 of the reflector 55. That is to say, the light-emitting element 45 and the light-shielding body 53 are buried in the cavity 56 with the sealing body 57. In other words, the sealing body 57 is formed to bury the light-emitting element 15 and the light-shielding body 53 on the package substrate 11. The upper (or top) surface of the sealing body 57 is a light emission surface 58 of the light-emitting device 10.

The sealing body 57 includes phosphor particles and the light-scattering material. There may be used as the phosphor particles, for example, phosphor particles which produce yellow fluorescence exited by blue light such as Ce-activated yttrium-aluminum-garnet phosphor (YAG:Ce), Ce-activated terbium-aluminum-garnet phosphor (TAG:Ce), orthosilicate phosphor ((BaSrCa)SiO$_4$, etc.), α-Sialon phosphor (Ca-α-SiAlON:Eu or the like) or the like. The light-scattering material is particles capable of light scattering such as TiO$_2$, SiO$_2$, ZnO, Al$_2$O$_3$ particles or the like.

FIG. 6 is an enlarged partially cross-sectional view of a portion M encircled with a broken line in FIG. 5B.

The semiconductor structure layer 49 is formed as InGaN-based semiconductor layers on the element substrate 47 such that an n-type semiconductor layer 49a, the light-emitting layer 49b and a p-type semiconductor layer 49c are layered in this order.

A p-electrode 50a made of Au is formed on a surface of the p-type semiconductor layer 49c of the semiconductor structure layer 49, for example. The p-electrode 50a is fixed via a metallic bump (not shown) onto the p-connection electrode 43a so as to be electrically connected to the p-connection electrode 43a.

Further, a contact hole 51 is formed in the semiconductor structure layer 49 so as to pass from a surface of the p-type semiconductor layer 49c thorough the p-type semiconductor layer 49c and the light-emitting layer 49b up to the n-type semiconductor layer 49a. The surfaces of the p-type semiconductor layer 49c and the light-emitting layer 49b exposed from the side surface of the contact hole 51 are covered with an insulation film 52 made of an insulation material.

The n-electrode 50b is formed by filling the contact hole 51 with an electric conductor such as Au or the like. That is to say, the n-electrode 50b is in contact with the n-type semiconductor layer 49a and electrically connected thereto. Further, the n-electrode 50b is formed to protrude from the surface of the p-type semiconductor layer 49c.

Then-electrode 50b is fixed onto the p-connection electrode 43b, at the protruding portion from the surface of the p-type semiconductor layer 49c, via the metallic bump (not shown) so as to be electrically connected to the p-connection electrode 43b. Therefore, the connection electrode 43b and the n-type semiconductor layer 49a are electrically connected each other via the n-electrode 50b.

As mentioned above, the light-shielding body 53 is a resin body or glass body on the upper surface of the element substrate 47 (i.e. surface side opposite to the lower surface on which the semiconductor structure layer 49 is formed) and covers the surface of the element substrate 47. The light-shielding body 53 comprises a base material 53a and light-shielding particles 53b contained and supported in the base material 53a.

The base material 53a is a resin material or glass material such as silicone-based resin, epoxy-based resin, acrylic-based resin or the like.

The light-shielding particles 53b is a black pigment particles having insulation quality and absorbing outgoing light from the light-emitting layer 49b such as TiN or the like. For the light-shielding particles 53b, titanium-based black pigment particles can be used, for example. The titanium-based black particles in the present Embodiment is a titanium black available from Mitsubishi Materials Electronic Chemicals Co., Ltd., which is titanium-based black particles of mixture of TiO and TiN having a color lightness L*=0(black)–L*=100(white)) of less than or equal to 16 in a L value ((L*, a*, b*) color space, and having the diameters of primary particles of 80-100 nm. It is preferable that the light-shielding particles 53b are inorganic-based particles which are highly resistant to light and heat.

In case that the light-shielding body 53 is configured as a resin body, such a resin body can be formed by mixing the base material 53a, e.g. a liquid resin containing any solvent and the light-shielding particles 53b as a precursor of a liquid mixture and then dropping and coating the liquid mixture on the upper surface of the light-emitting element 15 and then curing and drying it, for example.

In case that the light-shielding body 53 is configured as a glass body, such a glass body can be formed by a sol-gel process (repetition of hydrolyzing and polymerization) for example. Specifically, the light-shielding body 53 can be formed by dispersing the light-shielding particles in an alkoxide of precursor as the base material to prepare a light-shielding particle dispersion sol and then gelling it as a gel state and then applying the gel state on the upper surface of the light-emitting element 45 and then heating it, for example.

In addition, the light-shielding body 53 can be formed in a dome shape on the upper surface of the light-emitting element 45. The light-shielding body 53 is composed such that the thickness of the central portion is thicker in comparison with the peripheral portion. Further, the light-shielding body 53 is formed only on the upper surface of the element substrate 47 without covering the side surface of the element substrate 47. Namely, it is preferable that the light-shielding body 53 is formed to cover only a surface of the element substrate 47 opposite to the package substrate 41.

For example, in order that the liquid mixture of the precursor of resin and the light-shielding particles 53b has a suitable surface tension to the upper surface of the element substrate 47 when the liquid mixture is supplied thereto, the liquid mixture materials are selected and the liquid mixture blending ratio is adjusted, thereby the light-shielding body 53 is formed only on the upper surface of the element substrate 47 without wettedly spreading of the liquid mixture on the side surface of the element substrate 47.

Further, an outer edge of the upper surface of the element substrate 47 defines a formation range of the light-shielding body 53 on the upper surface of the element substrate 47.

That is to say, it is capable of making an outer edge of the lower surface of the light-shielding body 53 coincide with the outer edge of the upper surface of the element substrate 47. As a result, it achieves to improve the reproducibility of the shape of the light-shielding body 53, thereby to lead to yield good productivity of the light-emitting devices.

As mentioned above, in the light-emitting device 40, the light-shielding body 53 covers the upper surface of the element substrate 47. Therefore, light emitted from the upper surface of the light-emitting layer 49b enters into the transparent element substrate 47 to be transmitted through the light-shielding body 53 on the upper surface of the element substrate 47 and then is transmitted into the sealing body 57, or to be transmitted through the element substrate 47 and then is transmitted from the side surfaces of the element substrate 47 into the sealing body 57.

Light emitted from the upper surface of the element substrate 47 within light emitted from the upper surface of the semiconductor structure layer 49 is transmitted into the light-shielding body 53. A certain portion of the entered light into the light-shielding body 53 is absorbed by the light-shielding particles 53b, remaining light not absorbed is transmitted through the light-shielding body 53 and enters into the sealing body 57. Namely, the emission light from the upper or top surface and the side surfaces of the element substrate 47 is absorbed by the light-shielding body 53 to be attenuated, resulting in adjustment of the luminous intensity, prior to entering the sealing body 57.

The emission light from the upper surface of the element substrate 47 within light emitted from the upper surface of the semiconductor structure layer 49 is transmitted to the sealing body 57 without entering into the light-shielding body 53.

The emission light from the side surface of the semiconductor structure layer 49 is transmitted to the sealing body 57 without entering into the light-shielding body 53 and the element substrate 47.

As mentioned above, the emission light from the light emission surface 58 of the light-emitting device 40 comprises the attenuated light passing through the light-shielding body 53, the radiated light from the side surface of the element substrate 47 without entering the light-shielding body 53 and the emission light from the side surface of the semiconductor structure layer 49. The luminous intensity of the emitted light from the light emission surface 58 can be adjusted by changing an attenuation factor of light transmitted through the light-shielding body by controlling the concentration of the light-shielding particles 53b in the light-shielding body 53.

As mentioned above, the emission light from the light-emitting layer 49b in the present Embodiment is blue light. Further, the sealing body 57 includes silicate phosphor particles of yellow luminescence. The silicate phosphor is excited by the blue light to emit yellow luminescence i.e. complementary color of blue. Therefore, by the additive color mixture of the blue light and the yellow light, the emission light from the light emission surface 58 becomes white light.

As mentioned above, it is possible to make a state close to perfect light-shielding of light emitted from the upper surface of the element substrate 47 by setting the concentration of the light-shielding particles 53b in the light-shielding body 53 to a concentration value higher than a certain constant value. That is to say, when the concentration of the light-shielding particles 53b is set the certain constant value, the emission light from the light-emitting element 45 is radiated only from the side surface of the element substrate 47, thereby its luminous intensity is hardly changed even if raising the concentration of the light-shielding particles 53b. As a result, the Embodiment's controllability to the concentration of the light-shielding particles 53b in the light-shielding body 53 becomes ease, thereby to obtain stabilization of the luminous intensity of light emitted from the light emission surface 28 among individuals of the light-emitting device 40. That is to say, the Embodiment readily provides manufacturing of the light-emitting devices having the same luminous intensity with proper productivity and high yield.

In the light-emitting device 40 of the present Embodiment, the upward outgoing light from the semiconductor structure layer 49 to the light emission surface 58 has a shorter optical path length in comparison with light transmitted toward the horizontal direction within the semiconductor structure layer 49. At least a portion of light with the short optical path length is absorbed by the light-shielding body 53.

Such light with the short optical path length is subjected insufficiently to mixed color adjusting which is caused both by light scattering with the light-scattering material and wavelength conversion occurred by phosphor particles. Then the light with the short optical path length is radiated from the light emission surface 58 with inadequate mixed color adjusting. Therefore, there is apt to exhibit an uneven chromaticity region on the light emission surface 58, for example, the white emission light is partially bluish or the like.

In the light-emitting device 40, at least on portion of light with the short optical path lengths is absorbed by the light-shielding body 53. As a result, the occurrence phenomenon of the insufficient region of mixed color adjusting is suppressed in the emission light from the light emission surface 58. Therefore, the mixed color adjusting caused by the light-scattering material and phosphor is sufficiently exhibited on the light emission surface 58, so that more uniformized light in the chromaticity is obtained from the light emission surface 58.

Further, the light-emitting device 40 has a propensity that the upward outgoing light from the semiconductor structure layer 49 to the light emission surface 58 is not sufficiently scattered because the optical path length of the outgoing light therebetween is short. As a result, the light emission surface 58 is apt to have a central portion having a high luminance region, for example, so that it may cause non-uniform of luminance of the emission light from the light emission surface 58.

In the light-emitting device 40, at least a portion of light with the short optical path length is absorbed by the light-shielding body 53, thereby the occurrence phenomenon of the foregoing high luminance region is suppressed. Therefore, according to the light-emitting device 40 of Embodiment 1, the light-scattering caused by the light-scattering material is sufficiently exhibited, so that more uniformized light with luminance is obtained from the light emission surface 58.

As mentioned above, in the light emission surface 58, the light-scattering caused by the light-scattering material is sufficiently exhibited while the mixed color adjusting caused by fluorescence of the phosphor particles is sufficiently obtained, luminance, so that more uniformized light with luminance is obtained.

Further, the light-emitting device 40 of Embodiment 1 has the light-shielding body 53 including the light-shielding particles 53b for adjusting the luminous intensity such that the light-shielding body 53 is formed only on the upper surface of the light-emitting element 45 and, the light-shielding body 53 and the light-emitting element 45 are buried in the sealing body 57. The sealing body 57 includes phosphor particles and the light-scattering material, thereby to exhibit the light scattering effect. Thus, little difference in device appearance occurs on the light emission surface side caused by presence/absence of addition of the light-shielding particles 53b into the light-shielding body 53. Therefore, according to the light-emitting device of the foregoing Embodiment, it is possible to adjust the luminous intensity without changing the design characteristic of the light-emitting device.

[Modified Examples]

Figure 7:
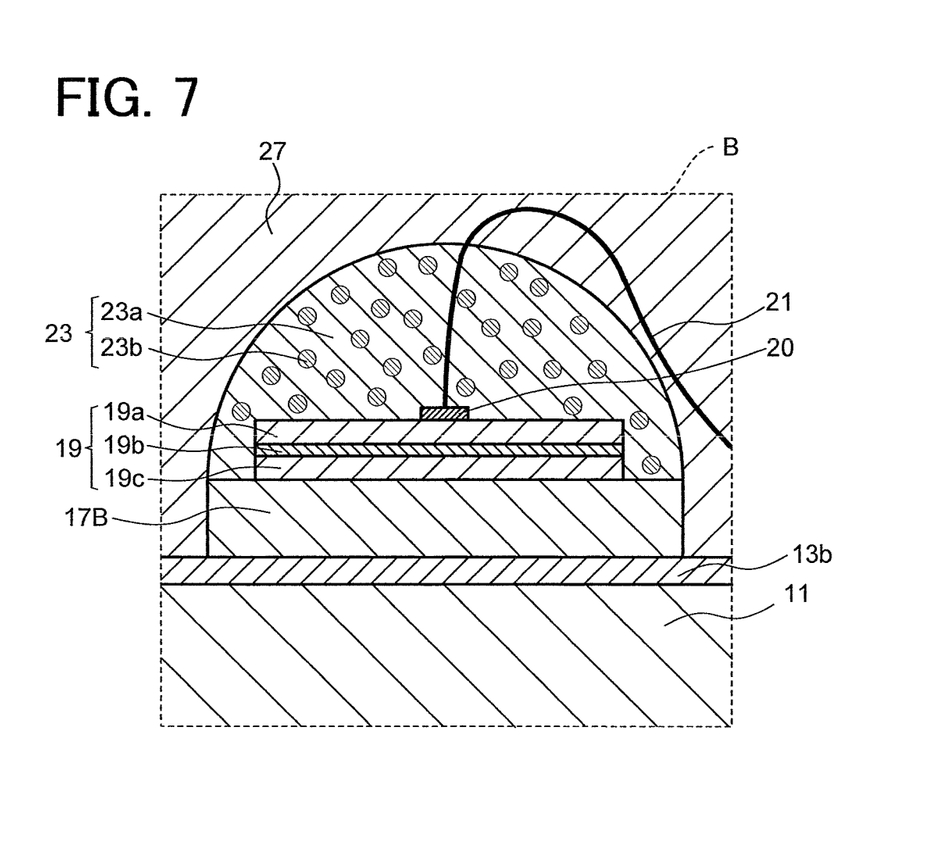
FIG. 7 is an enlarged partially cross-sectional view of a light-emitting device modified from Embodiment 1.

FIG. 7 is a partially enlarged cross-sectional view B of a light-emitting device modified from Embodiment 1 which uses a non-light-transmissive element substrate 17B instead of the light-transmissive element substrate 17. This modification has the same configuration in the upper surface view and a cross-sectional view as FIG. 1A and FIG. 1B.

The element substrate 17B is formed from a non-light-transmissive substrate made of Si or the like. There is a situation that the element substrate 17B cannot be used as a growth substrate because of difference of lattice constant with the semiconductor structure layer 19. The present modification is manufactured normally as follows: a semiconductor structure layer 19 is grown on another substrate such that a p-type semiconductor layer 19a, a light-emitting layer 19b and an n-type semiconductor layer 19c are layered in this order, after that the semiconductor structure layer 19 is joined on the element substrate 17B via a joining layer (not shown). It will be described as an example the case of forming the structure of FIG. 7.

Therefore, the semiconductor structure layer 19 of FIG. 7 is inverse to that of FIG. 2, i.e. the orders of layers layered from the lower surface toward the upper surface are inverse. Namely FIG. 7 shows that the element substrate 17B, the p-type semiconductor layer 19c, the light-emitting layer 19b and the n-type semiconductor layer 19a are layered in this order.

In the light-emitting device having the configuration of FIG. 7, the emission light from the light-emitting layer 19b is radiated from the upper surface of the element substrate 17B, only light passing through the light-shielding body is radiated from the light emission surface 28. It is possible to adjust the luminous intensity of emission light emitted from the light emission surface 28 by changing the concentration of the light-shielding particles 23b in the light-shielding body 23.

Figure 8:
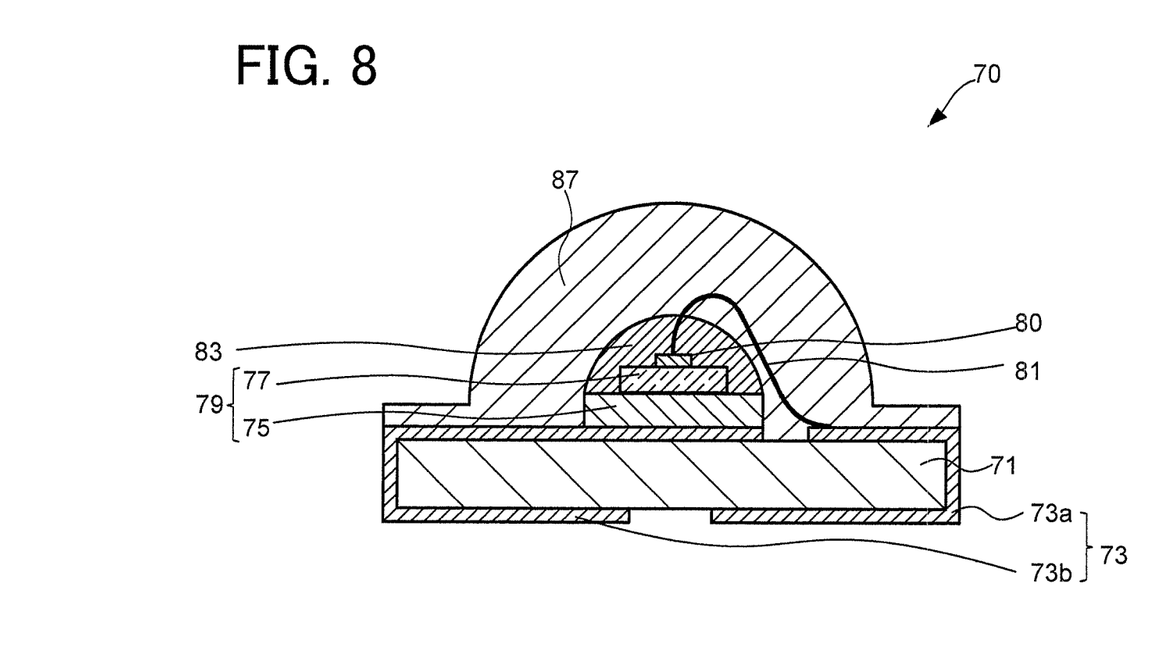
FIG. 8 is a cross-sectional view showing the light-emitting device modified from Embodiment 1.

FIG. 8 is a cross-sectional view of a light-emitting device 70 of modification which has a different sealing body shape than the foregoing ones without the reflectors 25, 55 (see FIG. 2 and FIG. 5). The configuration of the light-emitting element 79 including the first substrate of the package substrate 71, the connection electrode 73, the second substrate of the element substrate 75 and the semiconductor structure layer 77 and the configuration of the surface electrode 80, the bonding wire 81 and the light-shielding body 83 are the same as the Embodiment 1.

In FIG. 8, the light-emitting element 75, the light-shielding body 83 and the bonding wire 81 are not surrounded by the reflector, they are buried on the package substrate 71 by a hemispherical shaped sealing body 87.

The sealing body 87 can be made of a light-transmissive resin such as silicone resin or the like and formed in a convex lens with the hemispherical or the like by compression molding or the like, for example. It is possible to use, for the sealing body 87, hybrid resins such as epoxy resin, epoxy-modified silicone resin or the like and the urethane resin. Further, the sealing body 87 can include phosphor particles, the light-scattering material. In addition, roles of the surface of the sealing body 87 can be served as a lens so that the emission light from the light-emitting element 79 is radiated upward.

In the Embodiment above mentioned, the light-shielding particles of titanium-based black particles with insulation quality is described. In addition to this, conductive black particles such as carbon or the like may be used for the light-shielding particles of the light-shielding body in the present invention. In that case, it is preferable to use particles having surfaces finished with an insulation process of silica or the like to prevent short circuit in the light-emitting device.

Further, it is possible to use various color particles other than black for the light-shielding particles as far as enabling to absorb or scatter the outgoing light from the semiconductor structure layer. For example, the light scattering particles of white or the like can be used.

Further, it is possible to adjust the thickness of the light-shielding body by viscosity of the liquid mixture including solvent, resin, and the light-shielding particles. Furthermore, it is possible to adjust the thickness and shape of the light-shielding body by repetition in multiple times of dropping or coating the liquid mixture of a precursor of resin materials or glass materials and the light-shielding particles during formation of the light-shielding body.

Though the usage of the electrically conductive element substrate is described in Embodiment 1, the invention is not limited to that. The element substrate of the present invention may be non-conductive. In that case, in order to ensure electrical conductivity to any conductive type semiconductor, an electrode structure similar to the semiconductor structure layer 49 of Embodiment 2 is formed and then p and n type electrodes are electrically connected to the n-connection electrode 13a and the p-connection electrode 13b respectively.

Although the foregoing Embodiment is described so that the sealing bodies 27, 57 includes phosphor particles, the light-scattering material, anyone of or both of phosphor particles and the light-scattering material may be not included in the sealing bodies 27, 57. Further, the sealing body need not necessarily be provided, the sealing body may be not provided.

When the light-emitting device of the foregoing Embodiment is seen from upward, the light-shielding body is formed only in a very small region within the upper surface of the light-emitting element. Therefore, the difference on the big appearance does not occur depend on presence/absence of the light-shielding body in the light-emitting device even without the sealing body.

Although the foregoing Embodiment is described so that the sealing body is buried in the cavity of the package, i.e. so-called bathtub type light-emitting device or a lens molding type shown in FIG. 8, the invention is not limited by that. For example, the invention may be applied to the Bullet-shaped light-emitting device.

The foregoing Embodiments 1 and 2 are described so that the light-emitting elements 15, 45 are formed to have semiconductor layers composed of the semiconductor structure layers 19, 49 grown on the element substrates 17, 47 respectively. However the foregoing light-emitting device 70 of modification as shown in FIG. 8 may be formed to have semiconductor layers composed of the semiconductor structure layers grown on a substrate which is different from the element substrates 17, 47. In this case, the grown semiconductor layers are changed with the element substrates 17, 47 as a support substrate.

In the foregoing embodiments, various configurations and materials or the like are only illustrated as simple examples. Thus, configurations and materials or the like may be appropriately selected according to the light-emitting device or the like.

The foregoing Embodiment is described so that the InGaN-based semiconductor structure layer is used for the light-emitting device, the invention is not limited to that. Various kind of materials may be used for the light-emitting device. For example, the AlGaInP-based, the GaAsP-based or the like may be used for the light-emitting device so that the semiconductor structure layer emits luminescent color other than blue. Further, regarding phosphor particles, the foregoing Embodiment is described so that silicate-based phosphor emitting yellow are excited blue light, the invention is not limited to that. Other phosphor particles having other structure are applicable. It is possible to control the combination of the wavelengths of the emission light from the semiconductor structure layer and phosphor particles so that the light-emitting device emits luminescent color other than white.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application No. 2015-165117 filed on Aug. 24, 2015 the entire contents of which are incorporated herein by reference.

What is claimed is:

1. A light-emitting device comprising:
    a first substrate;
    a light-emitting element which is mounted on said first substrate and includes (i) a second substrate, and (ii) a semiconductor structure layer which is formed on said second substrate and includes a light-emitting layer, wherein said second substrate is a light-transmissive substrate having light transmissivity to emission light emitted from said light-emitting layer;
    a light-shielding body which includes a material including light-shielding particles, the light-shielding body being provided on a side of the light-emitting element opposite from said first substrate such that the light-shielding body is provided on an upper surface of the second substrate opposite from said first substrate and such that the light-shielding body is not provided on any of side surfaces of the second substrate that intersect the upper surface of the second substrate; and
    a sealing body formed to bury said light-emitting element and said light-shielding body on said first substrate, wherein said sealing body includes at least one of phosphor particles and a light-scattering material,
    wherein an outer edge of a lower surface of the light-shielding body coincides with an outer edge of the upper surface of the second substrate,
    wherein the second substrate has an area in plan view that is smaller than an area in plan view of the first substrate, and the side surfaces of the second substrate directly contact the sealing body.

2. The light-emitting device according to claim 1, further comprising a frame formed on said first substrate on which said light-emitting element is mounted so as to surround said light-emitting element, wherein an inner side surface of said frame is a reflective surface which reflects emission light emitted from said light-emitting layer.

3. The light-emitting device according to claim 1, wherein the semiconductor structure layer is placed on the upper surface of the second substrate, and the semiconductor structure layer is covered with the light-shielding body.

4. The light-emitting device according to claim 1, wherein the light-emitting device has at least two kinds of optical paths, wherein in one of the kinds of optical paths light from the light-emitting layer passes through the second substrate and via the side surfaces of the second substrate to the sealing body, and wherein in another of the kinds of optical paths light from the light-emitting layer passes through the light-shielding body to the sealing body.

5. The light-emitting device according to claim 1, wherein the semiconductor structure layer is formed of an InGaN-based semiconductor, an AlGaInP-based semiconductor, or a GaAsP-based semiconductor.

6. The light-emitting device according to claim 1, wherein the second substrate is formed of SiC.

7. The light-emitting device according to claim 1, wherein the material of the light-shielding body is glass, a silicone-based resin, an epoxy-based resin, or an acrylic-based resin, and the light-shielding particles are titanium-based black pigment particles.

8. The light-emitting device according to claim 1, wherein the sealing body includes a silicone-based resin, and the phosphor particles which are of Ce-activated yttrium-aluminum-garnet phosphor, Ce-activated terbium-aluminum-garnet phosphor, orthosilicate phosphor, or α-Sialon phosphor.

9. The light-emitting device according to claim 1, wherein the sealing body includes a silicone-based resin, and the light-scattering material which is $TiO_2$, $SiO_2$, ZnO, or $Al_2O_3$.

10. The light-emitting device according to claim 1, wherein the first substrate is a glass epoxy substrate, a glass silicone substrate, or a ceramic substrate.

* * * * *